(12) United States Patent
Hummelink

(10) Patent No.: US 6,233,820 B1
(45) Date of Patent: *May 22, 2001

(54) METHOD FOR MANUFACTURING OF A MULTILAYER MICROWAVE BOARD AND BOARDS OBTAINED ON THE BASIS OF THIS METHOD

(75) Inventor: Edwin J. H. Hummelink, Haaksbergen (NL)

(73) Assignee: Hollandse Signaalapparaten B.V., Hengelo (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/002,080

(22) Filed: Dec. 31, 1997

Related U.S. Application Data

(63) Continuation of application No. 08/389,404, filed on Feb. 16, 1995, now abandoned.

(30) Foreign Application Priority Data

Feb. 22, 1994 (NL) .................................................. 9400261

(51) Int. Cl.[7] .................................................. H05K 3/02
(52) U.S. Cl. .................................. 29/847; 29/846; 29/852; 29/830; 174/266; 427/97
(58) Field of Search .............................. 29/846, 847, 852, 29/830; 174/261, 266; 427/97

(56) References Cited

U.S. PATENT DOCUMENTS

| | | | |
|---|---|---|---|
| 3,895,435 | * 7/1975 | Turner et al. ............................ | 29/625 |
| 4,179,800 | * 12/1979 | Takaba et al. .......................... | 29/625 |
| 4,468,414 | * 8/1984 | Van Vonno .............................. | 357/49 |
| 4,916,808 | * 4/1990 | Sanborn et al. ........................ | 29/847 |
| 4,975,142 | * 12/1990 | Iannacone et al. ................... | 156/630 |

* cited by examiner

*Primary Examiner*—Lee Young
*Assistant Examiner*—Rick Kiltae Chang
(74) *Attorney, Agent, or Firm*—Oblon, Spivak, McClelland, Maier & Neustadt, P.C.

(57) ABSTRACT

Method for manufacturing a multilayer microwave board in one operation. Individually etched layers of a laminate, such as duroid, are bonded to form a package and drilled after which the resulting holes are plated. Next, the superfluous connections are removed by drilling during which process each stripline-coax transition buried in the package is tuned by a correct selection of the drill diameter and the hole depth.

12 Claims, 2 Drawing Sheets

1

METHOD FOR MANUFACTURING OF A MULTILAYER MICROWAVE BOARD AND BOARDS OBTAINED ON THE BASIS OF THIS METHOD

This Appln is a con't of Ser. No. 08/389,404 filed Feb. 16, 1995, ABN.

BACKGROUND OF THE INVENTION

The invention relates to a method for manufacturing a multilayer microwave board in which individual layers of plated laminate can be provided with a conductor pattern and in which, in a repeated process, individual layers or semimanufactures are subsequently bonded or provided with holes, which holes are then plated for realizing connections between the separate conductor patterns.

The invention also relates to a multilayer microwave board comprising a bonded package of laminate provided with conductors and plated layers and with connections between the conductors in the form of plated through-holes.

The invention furthermore relates to a method for tuning a multilayer board provided with blind or buried vias.

Both multilayer microwave boards and related manufacturing methods are well-known in the art. Nevertheless, their field of application is limited owing to the expensive and time-consuming production and the high ratio of rejects. Moreover, several restrictions apply, particularly with respect to the realization of connections between the various conductor patterns, the so-called vias. Various types of connections that are possible in the manufacturing of conventional multilayer printed circuit boards, cannot, or only at a high ratio of rejects, be realized. Especially the production of blind vias, buried vias and sequential blind vias presents difficulties and the manufacturing of interlocked vias is even considered to be impossible. Also microwave multilayers comprising more than three layers are practically nonexistent.

SUMMARY OF THE INVENTION

The present method according to the invention is aimed at obviating these difficulties by the application of a simple and excellently reproducible method and is characterised in that the multilayer microwave board can be produced in one operation during which all layers are simultaneously bonded together to form a multilayer, which multilayer is subsequently provided with holes, which holes are then plated after which any excess plating is removed.

The multilayer microwave board according to the invention is characterised in that the holes penetrate the entire package and are at least substantially plated between the conductor patterns to be connected.

The method for tuning a multilayer microwave board manufactured according to a method well-known in the art is characterised in that after the actual production of the board a hole is drilled to at least one buried via in the board between a stripline and a plated hole, such that this connection is at least substantially ohmic in nature.

According to the known method, individual layers of plated laminate are provided with a conductor pattern and, where necessary, drilled after which the resulting holes are plated. These layers are then bonded under high pressure and temperature conditions. By repeatedly bonding the thus obtained semimanufactures and again drilling and plating the resulting holes, it is possible to realize more complex products.

Products realized on the basis of said known method are characterised by a high ratio of rejects, particularly since connections between the conductor pattern and plated holes fail at the high temperature and pressure required for the bonding process. This is particularly due to fluctuations in coefficients of expansion between metal parts and the laminate, although the high pressure and temperature also render the laminate viscous as a result of which any asymmetry surrounding a plated through-hole may cause a crack.

In the new, inventive method this problem is not experienced. It is further characterised in that the holes are provided by drilling right through the bonded package. Subsequently the holes are fully plated in a way known in the art after which any excess plating is mechanically removed, for instance by means of a drill.

A most favorable embodiment of the method is characterised in that a diameter of the drill is selected depending on the type of laminate and on the diameter of the plated hole in order to obtain optimized wave properties of the connection between the conductor pattern and the plating at that position. A favorable selection would for instance be a diameter of approximately 1.15 times the diameter of the plated hole.

A further favorable embodiment of the method is characterised in that the excess plating, depending on the type of laminate and the diameter of the plated hole, is removed in axial direction such that the wave properties of the connection between the conductor pattern and the plating at that position are optimized. It may then be effected that the connection at that position is at least substantially purely ohmic. A favorable implementation of this method, using a standard type of laminate of for instance $3/100$ inch is characterised in that a volume of excess plating is retained in axial direction at a length of 10–50 $\mu$m.

Since excess plating is mechanically removed in a multilayer microwave board according to the invention, the board is further characterised in that the holes, where the plating has been mechanically removed, have a larger diameter than the plated holes.

Depending on the type of laminate and the diameter of the plated hole, the larger diameter can be again selected such to yield favorable wave properties of the connection between the conductor pattern and the plating at that position, using a standard laminate of $3/100$ inch, for instance approximately 1.15 times the diameter of the plated hole.

A still further favorable embodiment of the multilayer microwave board according to the invention is furthermore characterised in that, depending on the type of laminate and the diameter of the plated hole, the plating between the conductor patterns to be connected extends at least slightly further in axial direction than merely the distance between these conductor patterns in order to obtain optimized wave properties of the connection at that position, for instance over 10–50 $\mu$m.

BRIEF DESCRIPTION OF THE DRAWINGS

The method of manufacture and the multilayer microwave board according to the invention will now be described with reference to the following figures, of which.

DETAILED DESCRIPTION OF THE INVENTION

Figure 1A:
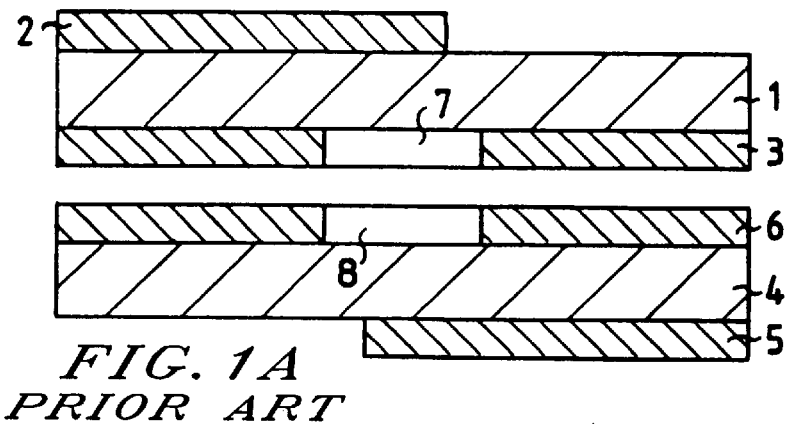
FIGS. 1A, 1B and 1C schematically represent the conventional construction of a multilayer microwave board provided with a blind via.
Figure 1B:
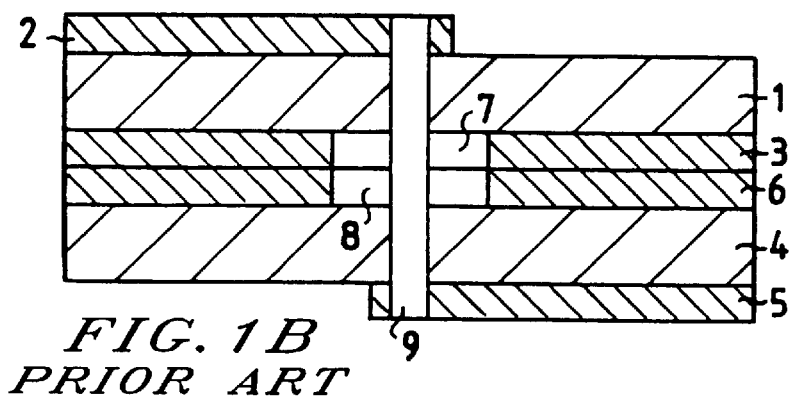
Figure 1C:
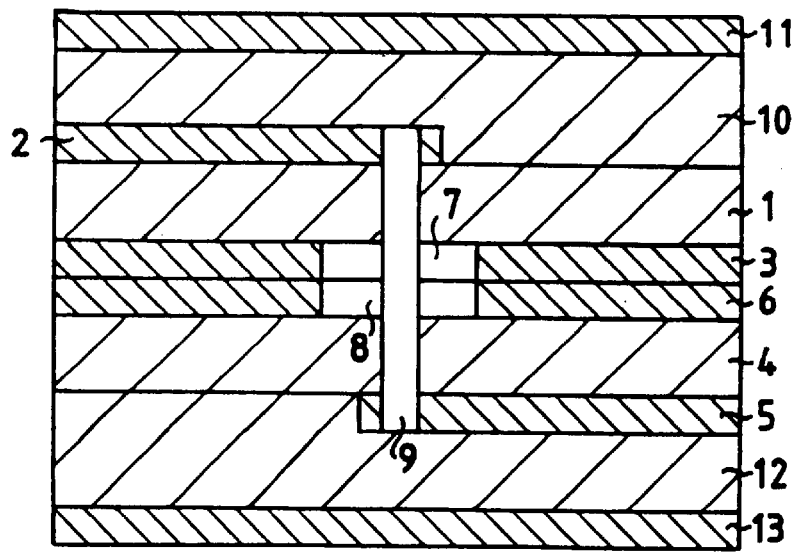

FIGS. 1A, 1B and 1C show the various steps in a possible manufacturing process for a multilayer microwave board according to the state of the art. In FIG. 1A, laminate 1, for instance duroid, is provided with a conductor pattern 2 and a ground plane 3. Laminate 4 is also provided with a conductor pattern 5 and a ground plane 6. A connection with favorable microwave properties shall be effected between conductor pattern 2 and conductor pattern 5. The ground planes are thereto provided with circular recesses 7, 8, usually obtained by means of etching. Subsequently, ground planes 3, 6 are bonded together after which a through-hole 9 is drilled through the package, which is then provided with a plating according to a method known in the art, as shown in FIG. 1B. As shown in Fig. 1C, laminate 10 provided with ground plane 11 and laminate 12 provided with ground plane 13 are then bonded to the package. These bonding treatments that take place under high pressure and temperature conditions, may impair the connection between conductor patterns 2 and 5. Particularly in case of complex multilayer microwave boards incorporating many connections and requiring many operations, a faulty connection is likely to occur. The connection thus effected between conductor patterns 2 and 5 is moreover found to possess less favorable wave properties. The transition from a stripline mode in conductor pattern 2 to a coaxial mode between plated hole 9 and recesses 7, 8 and subsequently in a stripline mode in conductor pattern 5 is found to cause reflections. Even a careful selection of all contributory components, such as hole diameter, plating thickness and diameter of recesses 7, 8, still yields a minimum reflection of −20 dB, which limits the range of application of the multilayer microwave board.

The known method of manufacture allows several variations that are of minor relevance. It is for instance possible to leave out ground plane 3 or ground plane 6 or to replace laminate 10 or laminate 12 by a thick adhesive layer as well-known in the art. This does not substantially change the complexity of the process, the ratio of rejects and the microwave properties.

Figure 2A:
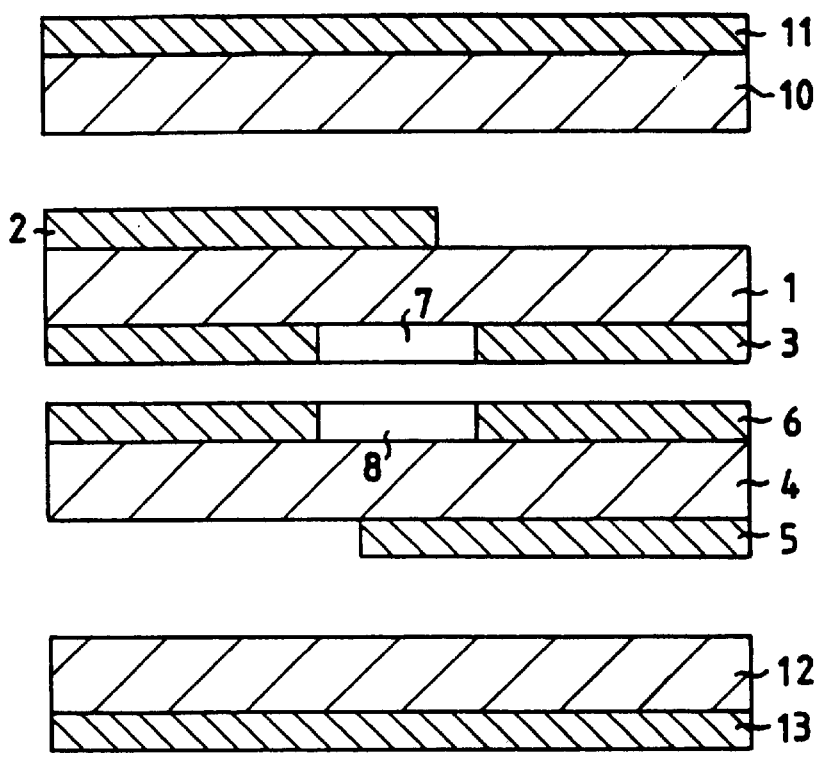
FIGS. 2A and 2B schematically represent the construction according to the invention of a multilayer microwave board provided with a blind via.
Figure 2B:
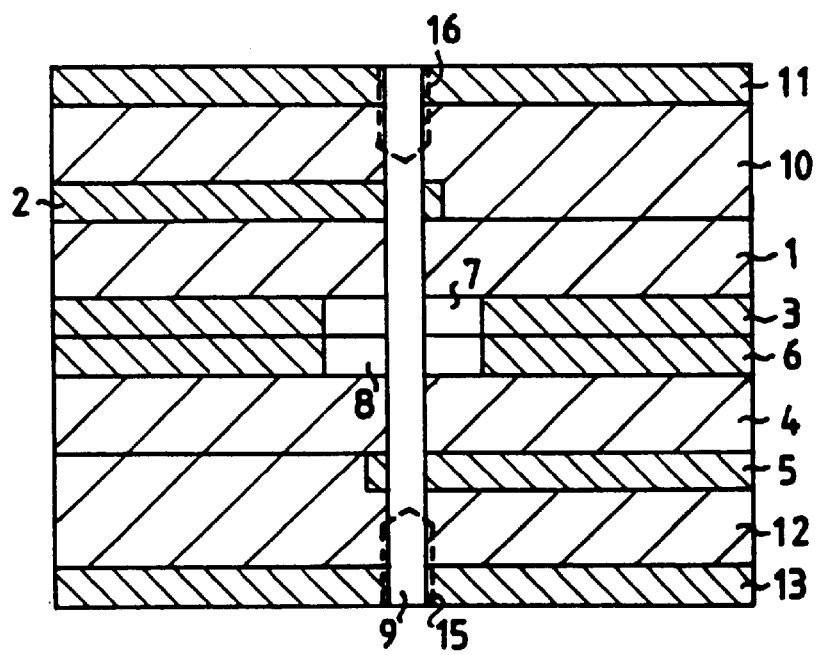

FIGS. 2A and 2B show the simplified method of manufacture of a multilayer microwave board according to the invention. In FIG. 2A, laminate 1 is provided with conductor pattern 2 and ground plane 3, and laminate 4 is provided with conductor pattern 5 and ground plane 6, and laminate 10 is provided with ground plane 11 and laminate 12 provided with ground plane 13. All layers are simultaneously bonded. In view of the connections between conductor patterns 2 and 5 having not yet been effected, this bonded construction is risk-free. After the bonding process, through-hole 9 is drilled through the entire package and is plated as shown in FIG. 2B. Subsequently, the superfluous parts 15, 16 of the plating are mechanically removed. Milling, spark machining or etching are acceptable alternatives for drilling. This enables all connections in a multilayer microwave board to be realized in one single operation comprising etching, bonding, drilling, plating and machining, which keeps down the costs and the ratio of rejects.

The mechanical removing of excess plating entails two options for tuning the connection between the conductor pattern and the plating; one option is to select the thickness of the drill, the second option entails the possibility to retain any excess plating, strictly speaking. This choice shall be made dependent on the type and thickness of the laminate and is to a minor extent dependent on the microwave frequency and the bonding process. Individual tuning will, however, not be required; once said parameters are known, the single determination of the tuning parameters enables an improvement of the reflection properties of the transitions of at least 10 dB, as a result of which the reflection decreases to assume a value of less than −30 dB. When using a standard laminate of 3/100 inch, this can usually be directly achieved by using a drill having a diameter of approximately 1.15 times the diameter of the plated hole and by retaining in axial direction 10–50 μm of the excess plating. If too much plating is retained, the transition will be capacitive in nature, if too much plating is removed, the transition will be inductive in nature. This rule makes it easy to quickly obtain the desired result for each type of laminate.

With boards based on conventional design, it is likewise possible to tune the transition between the conductor pattern and the plated hole and to obtain an improvement of at least 10 dB. Since during the plating process some material is formed at the conductor pattern around the hole, the transition is capacitive in nature. By making a hole into the package shown in FIG. 1C, for instance by drilling, right through ground plane 11 and partly through laminate 10 in the direction of the plated hole 9, it is possible to effect a tuning of the transition, through which the transition becomes substantially ohmic in nature. Also in this case, individual tuning is not required and can be determined once on the basis of the laminate, the process and the frequency used.

A via is often surrounded by grounding pins. These are vias that make contact with all ground planes in order to facilitate a transition from the stripline mode in the conductor pattern to the coaxial mode between plated hole 9 and recesses 7, 8 and to prevent the occurrence of false modes. During manufacturing, these grounding pins can also be drilled and plated in the one operation after the adhesive bonding process.

I claim:

1. A method for manufacturing a tuned multilayer microwave board from individual layers of plated laminate, each of the individual layers provided with one of a conductor pattern and a conducting ground plane, comprising bonding the individual layers together to obtain a semimanufacture;

forming holes through the semimanufacture at locations where connections between separate conductor patterns are desired;

plating the holes to form the connections;

tuning the connections between the conductor pattern to minimize reflections of the connections by removing excess plating from the holes; and determining an amount of plating to remove in the tuning step to minimize the reflections to assume a value of less than −30 dB.

2. The method according to claim 1, wherein the excess plating is removed by drilling.

3. The method according to claim 2, wherein a diameter of a drill is selected depending on a type of laminate and on a diameter of the plated holes to obtain optimal wave properties.

4. The method according to claim 2, wherein the excess plating is removed in an axial direction so that a volume of the excess plating, depending on a type of laminate and on a diameter of the plated holes, is retained for obtaining optimal wave properties.

5. The method according to claim 1, wherein the determining step is performed only once for a plurality of manufactured tuned multilayer microwave boards.

6. The method according to claim 1, wherein the determining step is based on at least one of 1) a type of the laminate, 2) an operating microwave frequency of the manufactured tuned multilayer microwave board, 3) a diameter of the plated hole, 4) a bonding process used in the bonding step, and 5) a thickness of the laminate.

7. A method for manufacturing a tuned multilayer microwave board from individual layers of plated laminate, each of the individual layers provided with one of a conductor pattern and a conducting ground plane, comprising:

bonding the individual layers together to obtain a semimanufacture;

forming holes through the semimanufacture at locations where connections between separate conductor patterns are desired;

plating the holes to form the connections;

tuning the connections between the conductor pattern to obtain optimal wave properties by removing excess plating from the holes; and determining an amount of plating to remove in the tuning step to obtain the optimal wave properties by minimizing reflections between the conductor pattern to assume a value of less than −30 dB, wherein the excess plating is removed by drilling, the laminate has a thickness of 0.03 inch a diameter of a drill is selected depending on a type of laminate and is approximately 1.15 times a diameter of the plated hole to obtain optimal wave properties.

8. The method according to claim 7, wherein the determining step is performed only once for a plurality of manufactured tuned multilayer microwave boards.

9. The method according to claim 7, wherein the determining step is based on at least one of 1) a type of the laminate, 2) an operating microwave frequency of the manufactured tuned multilayer microwave board, 3) a diameter of the plated hole, 4) a bonding process used in the bonding step, and 5) a thickness of the laminate.

10. A method for manufacturing a tuned multilayer microwave board from individual layers of plated laminate, each of the individual layers provided with one of a conductor pattern and a conducting ground plane, comprising:

bonding the individual layers together to obtain a semimanufacture;

forming holes through the semimanufacture at locations where connections between separate conductor patterns are desired;

plating the holes to form the connections;

tuning the connections between the conductor pattern to obtain optimal wave properties by removing excess plating; and determining an amount of plating to remove in the tuning step to obtain the optimal wave properties by minimizing reflections between the conductor pattern to assume a value of less than −30 dB, wherein the excess plating is removed by drilling in an axial direction so that a volume of the excess plating, depending on a type of laminate and on a diameter of the plated hole is retained to obtain optimal wave properties, and the laminate has a thickness of 0.03 inch and the excess plating has a length of 10–50 $\mu$m.

11. The method according to claim 10, wherein the determining step is performed only once for a plurality of manufactured tuned multilayer microwave boards.

12. The method according to claim 10, wherein the determining step is based on at least one of 1) a type of the laminate, 2) an operating microwave frequency of the manufactured tuned multilayer microwave board, 3) a diameter of the plated hole, 4) a bonding process used in the bonding step, and 5) a thickness of the laminate.

* * * * *